United States Patent
Yeom et al.

(10) Patent No.: US 8,088,687 B2
(45) Date of Patent: Jan. 3, 2012

(54) METHOD FOR FORMING COPPER LINE HAVING SELF-ASSEMBLED MONOLAYER FOR ULSI SEMICONDUCTOR DEVICES

(75) Inventors: Seung Jin Yeom, Gyeonggi-do (KR); Jae Hong Kim, Gyeonggi-do (KR); Sung Goon Kang, Seoul (KR); Won Kyu Han, Seoul (KR)

(73) Assignees: Hynix Semiconductor Inc., Gyeonggi-do (KR); IUCF-HYU (Industry-University Cooperation Foundation Hanyang University), Seoul (KR)

( * ) Notice: Subject to any disclaimer, the term of this patent is extended or adjusted under 35 U.S.C. 154(b) by 179 days.

(21) Appl. No.: 12/491,826

(22) Filed: Jun. 25, 2009

(65) Prior Publication Data
US 2010/0244253 A1    Sep. 30, 2010

(30) Foreign Application Priority Data
Mar. 31, 2009   (KR) .................. 10-2009-0027416

(51) Int. Cl.
    *H01L 21/44*       (2006.01)
(52) U.S. Cl. .. 438/653; 438/758; 257/751; 257/E21.584
(58) Field of Classification Search .......... 438/584–688, 438/758; 257/751, E21.214, E21.584, E23.01
    See application file for complete search history.

(56) References Cited

U.S. PATENT DOCUMENTS
7,309,658 B2    12/2007  Lazovsky et al.
2004/0253826 A1* 12/2004  Ivanov et al. ................. 438/710

FOREIGN PATENT DOCUMENTS
| KR | 1020040063367 A | 7/2004 |
| KR | 1020050033513 A | 4/2005 |
| KR | 1020080072003 A | 8/2008 |
| WO | 2008/027205 A2 | 3/2008 |

OTHER PUBLICATIONS

Won-kyu Han, et al; "Pd Seed Layer for Electroless Cu Deposition on TaN Diffusion Barrier by Self-Assembled-Monolayer Method(SAM)", Kor. J. Mater. Res. vol. 17, No. 9, (2007), pp. 469-474.

A. Maestre Caro et al; "Screening self-assembled monolayers as Cu diffusion barriers", Microelectronic Engineering 85 (2008), 2047-2050.

* cited by examiner

*Primary Examiner* — Khiem D Nguyen
(74) *Attorney, Agent, or Firm* — Ladas & Parry LLP

(57) ABSTRACT

A copper line having self assembled monolayer for use in ULSI semiconductor devices and methods of making the same are presented. The copper line includes an interlayer dielectric, a self-assembled monolayer, catalytic particles on the monolayer, and a copper layer on the monolayer with the catalytic particles. The method includes the steps of forming an interlayer dielectric on a semiconductor substrate having a metal line forming region; forming a self-assembled monolayer on the metal line forming region; adsorbing catalytic particles on the self-assembled monolayer; forming using an electroless process a copper seed layer on the self-assembled monolayer having the catalytic particles adsorbed thereto; and forming a copper layer on the copper seed layer to fill in the metal line forming region.

32 Claims, 7 Drawing Sheets

METHOD FOR FORMING COPPER LINE HAVING SELF-ASSEMBLED MONOLAYER FOR ULSI SEMICONDUCTOR DEVICES

CROSS-REFERENCE TO RELATED APPLICATIONS

The present application claims priority to Korean patent application number 10-2009-0027416 filed on Mar. 31, 2009, which is incorporated herein by reference in its entirety.

BACKGROUND OF THE INVENTION

The present invention relates to a method for forming a copper line of a semiconductor device, and more particularly, to a method for forming a copper line having a self-assembled monolayer for use in ULSI semiconductor devices in which the method is less prone to creating unwanted voids and seams in the resultant copper line.

As integrated circuits become more highly resolved, i.e., higher integration, due to demands for higher performances and then physical limitations necessarily arise when adopting the existing materials and processes to make these highly integrated circuits.

For example, aluminum is currently chosen as a material for forming a metal line which electrically connects elements in an integrated circuit. Aluminum exhibits excellent electrical conductivity and is corrosion resistant. Aluminum can also be easily etched in a dry type environment technique. Furthermore aluminum is highly adhesive to $SiO_2$ which is often used as a dielectric. Unfortunately, as line widths of these highly integrated semiconductor devices decrease down to the nanometer level, aluminum exhibits a number of undesirable properties for these purposes. In particular, the resistance of the aluminum ULSI metal lines increases. As a result, problems arise which are related to time delays, noise generation and power consumption. Furthermore, as the width of line decrease down to the ULSI level, the EM (electro migration) and the SIM (stress-induced migration) characteristics and the reliability of semiconductor device is expected to be compromised if aluminum is used.

Copper is most actively being researched as an alternative to aluminum primarily because copper has a specific resistance of 1.7 uΩcm which is lower than 2.65 uΩcm of aluminum. Further, it is known that copper is about two times more superior than aluminum in terms of their respective EM characteristics and the SIM characteristics.

Copper is not easy to etch. Because of this fact, damascene processes are often times used to form copper lines. In a method for forming a copper line by using a damascene process, after first defining a metal line forming region, a copper layer is deposited to fill in the metal line forming region. Then, the copper layer is polished down usually using CMP (chemical mechanical polishing) process to eventually define the copper metal line.

When filling in the copper layer in the metal line forming region, electroplating is often employed. A conductive layer is needed to enable electroplating and is generally formed using a PVD (physical vapor deposition) process. In this regard, as the width of a trench decreases, the aspect ratio of the trench necessarily increases. Then when the conductive layer is formed using a PVD process, step coverage is prone to being degraded largely because of a shadow effect. As a consequence, when filling in the metal line forming region with copper, voids are likely to be created in the metal line forming region. Under this situation, electroless plating has been proposed as an alternative to the electroplating.

Electroless plating has been widely used in printed circuit boards since 1960. In electroless plating, a metal layer is formed through self-oxidation and reduction without supplying electrons from an outside source.

In order to apply electroless plating at a ULSI (ultra-large-scale integrated) circuit scale, i.e., below a sub-micrometer level, it is necessary to uniformly form a copper seed layer to a thickness of several nanometers on the surface of the metal line forming region. However, in the case of a conventional sensitizing-activation method, due to the fact that catalytic particles have a wide size distribution that ranges from several nanometers to several micrometers, then it is understandable that unwanted agglomeration of these catalytic particles can occur. As a result of using these catalytic particles that have wide size distributions then voids and seams are likely to be created when plating copper with electroless plating techniques. As a result the reliability of a copper line at the ULSI scale become a problem because of the size distribution of these catalytic particles.

BRIEF SUMMARY OF THE INVENTION

Embodiments of the present invention are directed to a method for forming a self-assembled monolayer, a copper line of a semiconductor device, and a method for forming a copper line, which can form a copper seed layer to a uniform thickness of several nanometers when forming a copper line through electroless plating.

Also, embodiments of the present invention are directed to a method for forming a self-assembled monolayer, a copper line of a semiconductor device, and a method for forming a copper line, which can realize a high reliability by forming a copper seed layer to a uniform thickness as a thin film.

In one aspect of the present invention, a method for forming a self-assembled monolayer comprises the steps of modifying a surface of a semiconductor substrate to have hydrogen groups; flowing $Cl_2$ gas and irradiating UV onto the semiconductor substrate having undergone surface modification such that chlorine groups are substituted for the hydrogen groups bonded to the surface of the semiconductor substrate; and flowing $NH_3$ gas onto the surface of the resultant semiconductor substrate to substitute amine groups in place of the bonded chlorine groups.

The step of modifying the surface of the semiconductor substrate by sequentially dipping the semiconductor substrate in a piranha solution followed by a diluted HF solution.

After the step of flowing the $NH_3$ gas, the method may further comprise the step of baking the resultant semiconductor substrate to stabilize the amine groups bonding to the semiconductor substrate.

In another aspect of the present invention, a copper line of a semiconductor device comprises an interlayer dielectric formed on a semiconductor substrate which also has a metal line forming region within the interlayer dielectric; a self-assembled monolayer formed on a surface of the metal line forming region; catalytic particles adsorbed to a surface of the self-assembled monolayer; and a copper layer formed on the self-assembled monolayer having the catalytic particles adsorbed that substantially fills in the metal line forming region with copper.

The copper line of a semiconductor device may further comprise a barrier layer formed between the surface of the metal line forming region and the self-assembled monolayer.

The self-assembled monolayer comprises a material layer on a surface of which amine silane groups or thiol silane groups are bonded.

The catalytic particles comprise any one of Au, Cu, Pt, Ni and admixtures thereof.

The catalytic particles can have any size in which it is preferable that the catalytic particles have a mean diameter of about 2~3 nm.

The surface density distribution of the catalytic particles can be evenly or unevenly distributed at any density in which it is preferable that the catalytic particles are adsorbed in a relative even distribution density having a distance interval between adjacent adsorbed catalytic particles to be about 4~7 nm.

The copper layer includes a copper seed layer which is preferably formed using an electroless plating process.

In still another aspect of the present invention, a method for forming a copper line of a semiconductor device comprises the steps of forming an interlayer dielectric on a semiconductor substrate to have a metal line forming region; forming a self-assembled monolayer on the interlayer dielectric including a surface of the metal line forming region; adsorbing catalytic particles onto a surface of the self-assembled monolayer; forming, using an electroless plating, a copper seed layer on the self-assembled monolayer having the catalytic particles adsorbed thereto; and forming a copper layer on the copper seed layer to substantially fill in the metal line forming region.

After the step of forming the interlayer dielectric having the metal line forming region and before the step of forming the self-assembled monolayer, the method may further comprise the step of forming a barrier layer on the interlayer dielectric including a surface of the metal line forming region.

The step of forming the self-assembled monolayer may comprise the steps of: modifying a surface of the semiconductor substrate including the metal line forming region to have hydroxyl groups; dipping the resultant surface-modified semiconductor substrate in a chemical which is prepared by mixing a substance having amine silane groups or silane thiol groups in an organic solvent; and silanizing the amine silane groups or thiol silane groups.

The step of modifying the surface of the semiconductor substrate to have the hydroxyl groups is preferably by dipping the resultant semiconductor substrate into a piranha solution which is prepared by mixing together $H_2SO_4$ and $H_2O_2$.

The substance having amine silane groups may comprise any number of substances such as those selected from the group consisting of aminomethyl trimethoxy-silane, 2-aminoethyl trimethoxy-silane, 3-aminopropyl trimethoxy-silane, 4-aminobutyl trimethoxy-silane, aminomethyl triethoxy-silane, 2-aminoethyl triethoxy-silane, 3-aminopropyl triethoxy-silane, 4-aminobutyl triethoxy-silane, aminomethyl tripropoxy-silane, 2-aminoethyl tripropoxy-silane, 3-aminopropyl tripropoxy-silane, 4-aminobutyl tripropoxy-silane, aminomethyl tributoxy-silane, 2-aminoethyl tributoxy-silane, 3-aminopropyl tributoxy-silane, and 4-aminobutyl tributoxy-silane, in which 3-aminopropyl triethoxy-silane is preferred. The substance having thiol silane groups may comprise any number of substances such as those selected from the group of mercaptomethyl trimethoxy-silane, 2-mercaptoethyl trimethoxy-silane, 3-mercaptopropyl trimethoxy-silane, 4-mercaptobutyl trimethoxy-silane, mercaptomethyl triethoxy-silane, 2-mercaptoethyl triethoxy-silane, 3-mercaptopropyl triethoxy-silane, 4-mercaptobutyl triethoxy-silane, mercaptomethyl tripropoxy-silane, 2-mercaptoethyl tripropoxy-silane, 3-mercaptopropyl tripropoxy-silane, and 4-mercaptobutyl tripropoxy-silane, in which 3-mercaptopropyl trimethoxy-silane is preferred. Other substance equivalent to the thiol silane groups such as the equivalent selenol silane equivalent derivatives to the above thiol silane derivatives are also envisioned in this invention.

The chemical is prepared by mixing about 15~35 gram of the substance having amine silane groups or thiol silane groups in about 1 liter of the organic solvent.

The step of silanizing the amine silane groups or thiol silane groups is implemented at a temperature of about 50~70° C. for about 60~400 minutes.

After the step of silanizing the amine silane groups or thiol silane groups, the method further comprises the steps of: cleaning the resultant semiconductor substrate so that reaction residues are removed; and baking the resultant cleaned semiconductor substrate so that a bonding structure of the amine silane groups or thiol silane groups is stabilized.

The step of cleaning the resultant semiconductor substrate is implemented using at least one of an ethanol wash and/or an ultrasonication cleaning.

The step of baking the resultant cleaned semiconductor substrate is implemented in a vacuum oven at a temperature of about 80~120° C. for about 20~40 minutes.

The step of forming the self-assembled monolayer preferably comprises the steps of: modifying a surface of the semiconductor substrate including the metal line forming region to have hydroxyl groups; flowing $Cl_2$ gas and irradiating UV onto the semiconductor substrate having undergone surface modification such that chlorine groups are bonded to the surface of the semiconductor substrate; and flowing $NH_3$ gas onto the surface of the resultant semiconductor substrate such that the bonded chlorine groups are substituted by amine groups.

The step of modifying the surface of the semiconductor substrate is preferably implemented by sequentially dipping the semiconductor substrate into a piranha solution made from $H_2SO_4$ and $H_2O_2$ mixed together and dipped in a diluted HF solution.

The piranha solution can have any ratio of $H_2SO_4$ and $H_2O_2$ mixed together in which it is preferred that the piranha solution is prepared by mixing the concentrated $H_2SO_4$ and 30% $H_2O_2$ at a ratio of 3:2.

The semiconductor substrate is preferably dipped in the piranha solution and in the diluted HF solution for about 4~6 minutes and about 8~12 minutes, respectively.

When flowing the $Cl_2$ gas, $N_2$ gas is preferably simultaneously flowed.

The $Cl_2$ gas and the $N_2$ gas are flowed such that a partial pressure of the $Cl_2$ gas is maintained at about 1~5 Torr.

The step of irradiating with ultraviolet (UV) radiation is preferably implemented for about 10~60 seconds when the semiconductor substrate is maintained at a temperature of about 25~75° C.

The step of flowing the $NH_3$ gas is implemented for about 10~15 minutes such that a partial pressure of the $NH_3$ gas is maintained at about 8~12 Torr.

After the step of flowing the $NH_3$ gas, the method may further comprise the step of baking the resultant semiconductor substrate so that a bonding structure of the amine groups is stabilized.

The step of baking the resultant semiconductor substrate is preferably implemented at a temperature of about 25~75° C.

The catalytic particles may comprise any catalytic particles in which it is preferable that the catalytic particles comprise any one of Au, Cu, Pt, Ni and admixtures thereof.

The catalytic particles may have any shape, size and dimension in which the catalytic particles preferably have a mean diameter of about 2~3 nm.

The step of adsorbing the catalytic particles is implemented dipping the resultant semiconductor substrate, which is formed with the self-assembled monolayer, for about 40~100 minutes in an aqueous solution in which catalytic particles are dispersed.

The step of adsorbing the catalytic particles is implemented in a manner such that at least one of a pH and a temperature of the aqueous solution, in which the catalytic particles are dispersed, is changed such that an interval between the adsorbed catalytic particles can be adjusted.

The pH of the aqueous solution in which the catalytic particles are dispersed can be at any pH in which it is preferable that the pH is adjusted to about 2.5~5.

The temperature of the aqueous solution, in which the catalytic particles are dispersed, may be any temperature in which it is preferable that the temperature is adjusted to about 40~60° C.

The mean interval between adjacent adsorbed catalytic particles can be any interval in which it is preferable that the mean interval distance is adjusted to about 4~7 nm.

After the step of adsorbing the catalytic particles and before the step of forming the copper seed layer, the method may further comprise the step of cleaning the resultant semiconductor substrate having the catalytic particles adsorbed thereto so that reaction residues are substantially removed.

The step of cleaning the resultant semiconductor substrate with highly purified water, such as distilled water or deionized water, is preferably implemented at least one time cleaning cycle.

The step of forming the copper layer is preferably implemented using electroless plating techniques.

The step of forming the copper layer is implemented for about 50~100 seconds in an electroless plating solution.

The step of forming the copper layer is preferably implemented using electroplating.

After the step of forming the copper layer to fill the metal line forming region, the method further may comprise the step of removing the copper layer using a CMP process until the interlayer dielectric is exposed.

DESCRIPTION OF SPECIFIC EMBODIMENTS

Hereafter, specific embodiments of the present invention will be described in detail with reference to the attached drawings. The drawings are not necessarily to scale and in some instances proportions may have been exaggerated in order to more clearly depict certain features of the invention.

Figure 1:
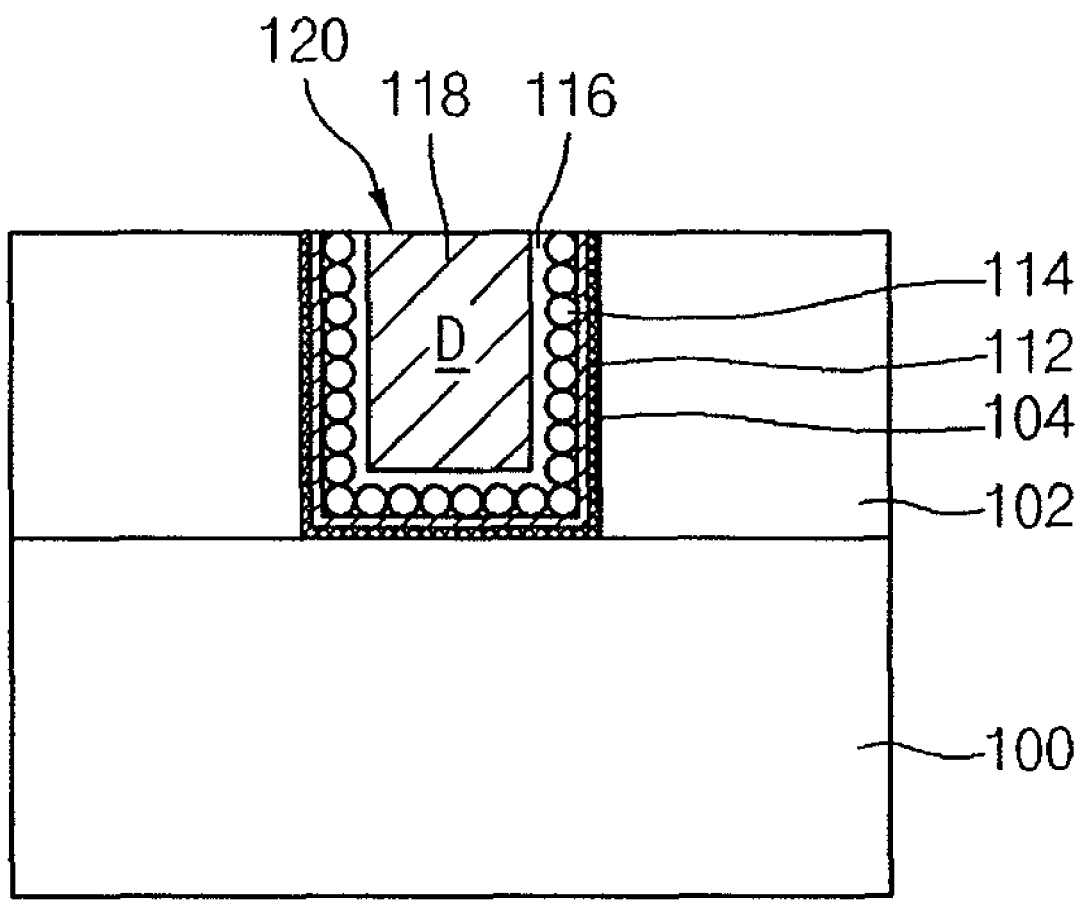
FIG. 1 is a sectional view illustrating a copper line of a semiconductor device in accordance with an embodiment of the present invention.

FIG. 1 is a sectional view illustrating a copper line of a semiconductor device in accordance with an embodiment of the present invention.

Referring now to FIG. 1, an interlayer dielectric 102 is shown formed on a semiconductor substrate 100 having a metal line forming region D. A barrier layer 104 is shown formed on the surface of the metal line forming region D, and a copper line 120 is shown formed on the barrier layer 104 that substantially fills in the metal line forming region D. The semiconductor substrate 100 can be understood as having any number of predetermined understructures (not shown) such as a transistor understructure (not shown). The barrier layer 104 can comprise, for example, a single layer of a Ti layer or a TiN layer or a stack layer of a Ti layer and a TiN layer.

The copper line 120 includes a self-assembled monolayer 112 which is formed on the surface of the metal line forming region D, a plurality of catalytic particles 114 which are adsorbed to the surface of the self-assembled monolayer 112, a copper seed layer 116 which is formed on the self-assembled monolayer 112 having the catalytic particles 114 adsorbed thereto, and a copper layer 118 which is formed on the copper seed layer 116 which substantially fills in the metal line forming region D.

The self-assembled monolayer 112 is a material layer having a surface in which amine silane groups or thiol silane groups are bonded. The catalytic particles 114 comprise particles of any one selected from Au, Cu, Pt and Ni, preferably, Au. The catalytic particles 114 preferably have a mean diameter of about 2~3 nm and are adsorbed to the surface of the self-assembled monolayer 112, preferably, at an interval of about 4~7 nm.

The copper seed layer 116 is preferably formed by using an electroless plating process. As will be described later in detail, the copper seed layer 116 is formed to a substantially uniform thickness of about several nanometers due to the formation of the self-assembled monolayer 112 and the catalytic particles 114. The copper layer 118 can be preferably formed using electroless plating continuously after forming the copper seed layer 116 which is made from using electroless plating. Alternatively, the copper layer 118 can be formed using an electroplating technique which is different from the formation technique of the copper seed layer 116.

Since the copper seed layer can be formed at a relative uniform thickness of several nanometers due to the formation of a self-assembled monolayer on the surface of a metal line forming region and the adsorption of catalytic particles to the surface of the self-assembled monolayer, it is then possible to prevent or at least minimize the occurrence of voids and seams from being created in the metal line forming region. Accordingly, the resultant copper line according to this embodiment of the present invention can exhibit an improved reliability. Consequently, in the present invention, a ULSI circuit below a sub-micrometer level can be realized through electroless plating.

FIGS. 2A through 2E are sectional views illustrating the processes of a method for forming a copper line of a semiconductor device in accordance with another embodiment of the present invention. Some of the more important steps of the preferred method will be described below.

Figure 2A:
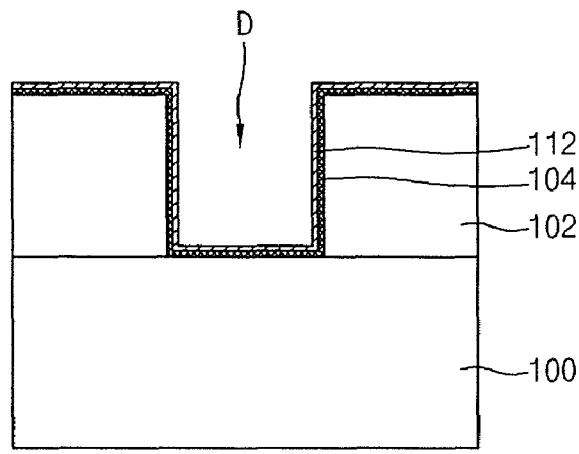
FIGS. 2A through 2E are sectional views illustrating the processes of a method for forming a copper line of a semiconductor device in accordance with another embodiment of the present invention.

Referring now to FIG. 2A, after forming an interlayer dielectric 102 on a semiconductor substrate 100, a metal line forming region D is defined in the interlayer dielectric 102 preferably for use in a damascene or a dual damascene process. The metal line forming region D is defined in a shape which includes a trench for use in a subsequent damascene process. Alternatively, is the metal line forming region D can be defined for use in a dual damascene process. In this case, the metal line forming region D is defined in a shape which includes a via-hole and a trench communicating with the via-hole.

A barrier layer 104 is formed on the interlayer dielectric 102 and on the metal line forming region D. The barrier layer 104 is formed, for example, as a single layer of a Ti layer or a TiN layer or a stack layer of a Ti layer and a TiN layer. A self-assembled monolayer 112 is then subsequently formed on the barrier layer 104.

One preferred method of forming the self-assembled monolayer 112 is the following. The semiconductor substrate 100 having the metal line forming region D is dipped in a piranha solution. The piranha solution is prepared by mixing, for example, concentrated $H_2SO_4$ and 30% $H_2O_2$ in a ratio of about 3:2. It is thought that the dipping of the semiconductor substrate 100 into the piranha solution results in forming hydroxyl groups (—OH) on the surface thereof so that surface modification is effected. The resultant surface-modified semiconductor substrate 100 is then exposed, preferably dipped, in a chemical preparation which is prepared by mixing a substance having amine silane groups or thiol silane groups in an organic solvent such as ethanol or toluene. In this state, the semiconductor substrate 100 is heated to a predetermined temperature so that the silanization reactions of either the amine silane groups or silane thiol groups are promoted at the surface.

Some of the preferred substances having either amine silane groups or thiol silane groups include, for example, 3-aminopropyl triethoxy-silane or 3-mercaptopropyl trimethoxy-silane. These chemicals are preferably prepared by mixing about 15~35 g of the substance having amine silane groups or thiol silane groups in 1 liter of the organic solvent, preferably ethanol or toluene. The semiconductor substrate 100 is then heated at a temperature to about 50~70° C. for about 60~400 minutes to promote the silanization reactions of either the amine silane groups or thiol silane groups at the surface of the semiconductor substrate 100.

Figure 3A:
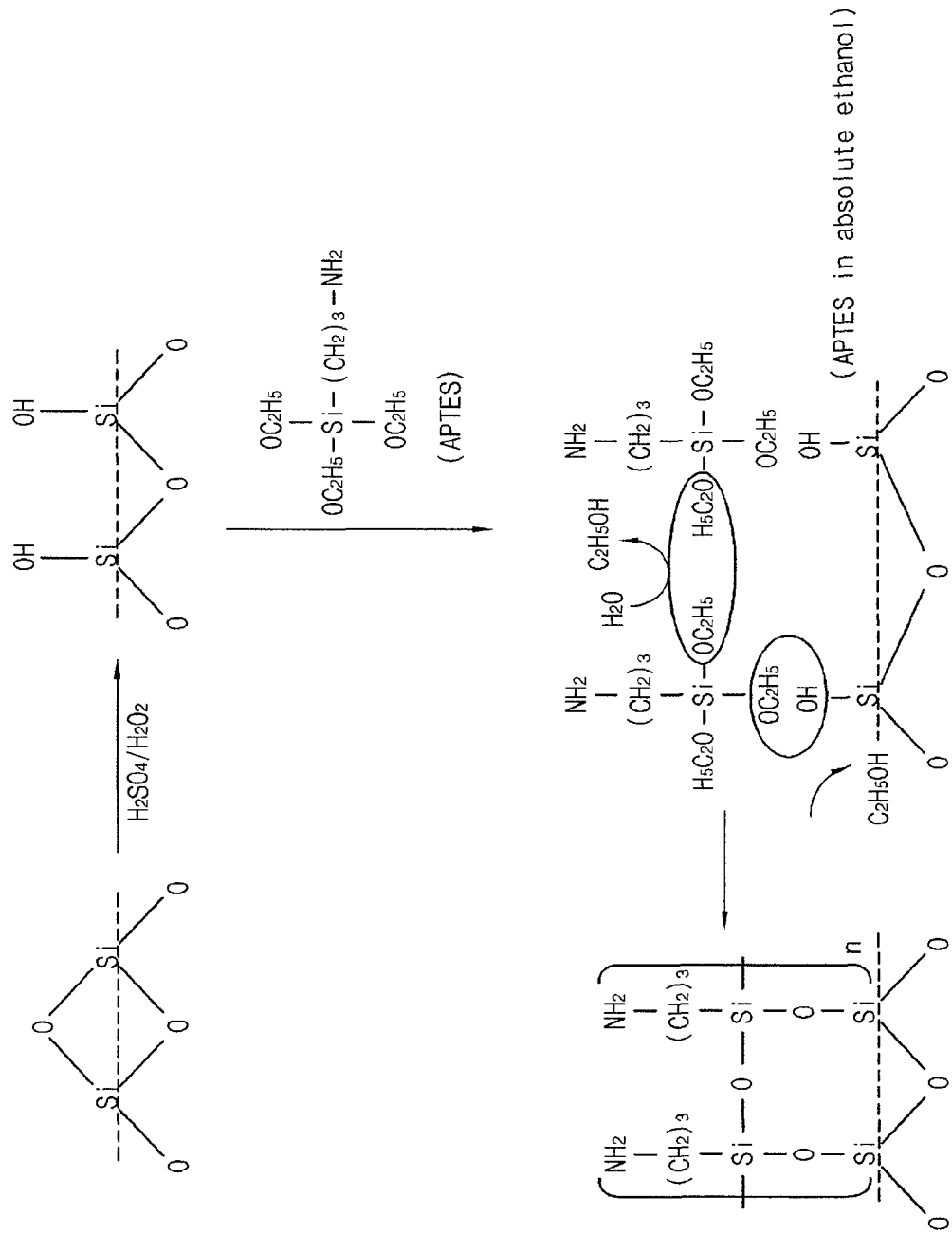
FIG. 3A is a reaction formula illustrating a reaction mechanism when forming a self-assembled monolayer having amine groups in accordance with another embodiment of the present invention.

FIG. 3A depicts a generalized reaction formula and a reaction mechanism which are thought to occur when forming the self-assembled monolayer having amine groups in accordance with another embodiment of the present invention. In the present embodiment, it is preferable that the semiconductor substrate is dipped in a chemical solution which is prepared by mixing about 25 g of 3-aminopropyl triethoxy-silane in about 1 liter of ethanol (preferably absolute ethanol). The semiconductor substrate dipped in the chemical is then heated at about 60° C. for about 3 hours.

Referring to FIG. 3A, it can be appreciated that amine groups ($NH_2$) are bonded to terminal ends due to the silanization reaction.

In the reaction formula depicted in FIG. 3A, before the semiconductor substrate is dipped in the chemical which is prepared by mixing about 25 g of 3-aminopropyl triethoxy-silane in about 1 liter of ethanol, the semiconductor substrate is first dipped in a piranha solution that forms the hydroxyl groups (—OH) at the surface thereof so that surface modification can be effected.

Figure 3B:
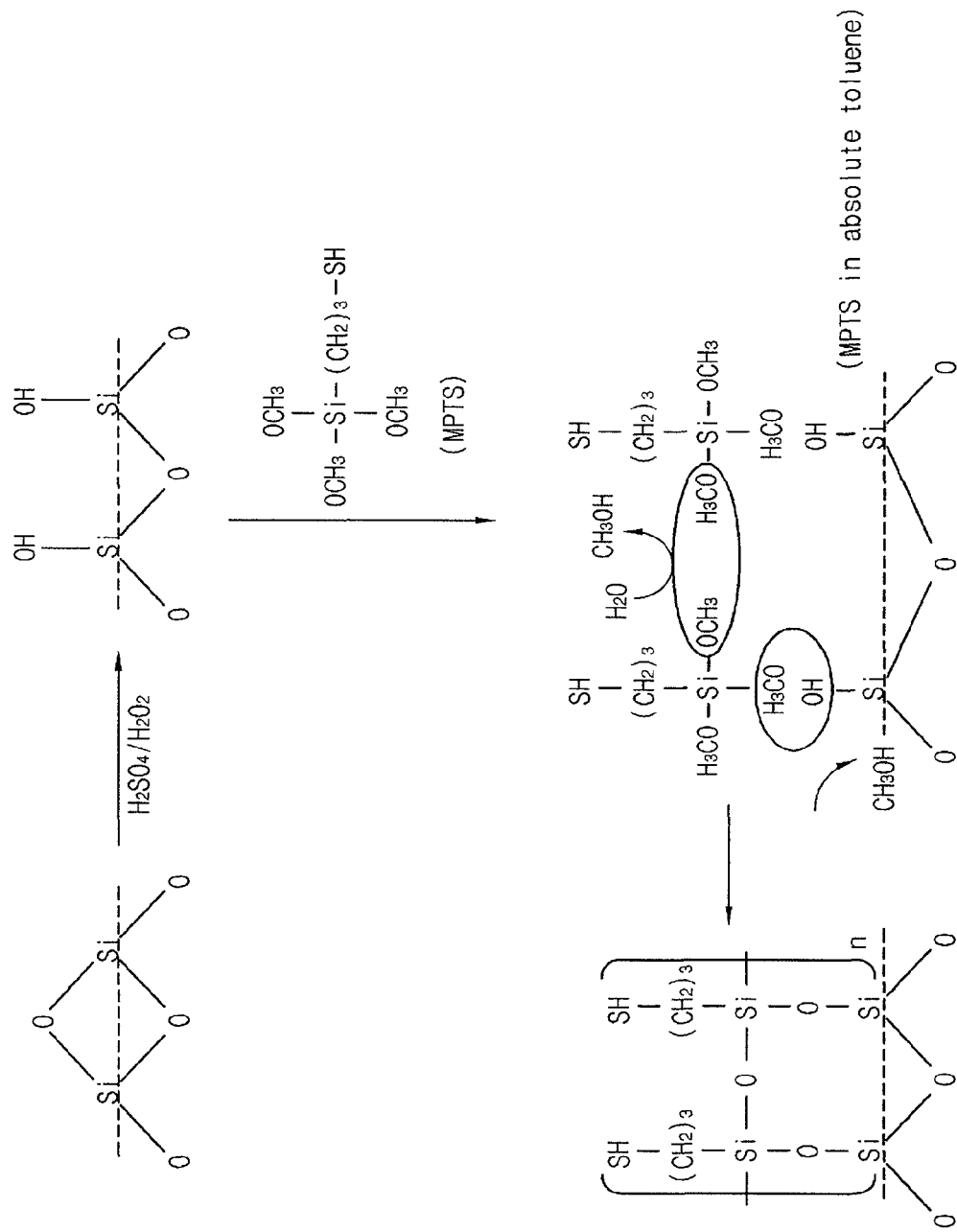
FIG. 3B is a reaction formula illustrating a reaction mechanism when forming a self-assembled monolayer having thiol silane groups in accordance with still another embodiment of the present invention.

FIG. 3B is a generalized reaction formula illustrating what is believed to be a reaction mechanism when forming a self-assembled monolayer having thiol silane groups in accordance with still another embodiment of the present invention. In the present embodiment, the semiconductor substrate is exposed, preferably dipped, in a chemical solution which is prepared by mixing about 25 g of 3-mercaptopropyl trimethoxy-silane in about 1 liter of toluene. While the semiconductor substrate is dipped in the chemical solution it is heated at about 60° C. for about 3 hours.

Referring to FIG. 3B, it can be appreciated that thiol groups (—SH) are bonded to the terminal ends of a bonding structure due to the silanization reaction.

In the reaction formula of FIG. 3B, before the semiconductor substrate is dipped in the chemical solution which is preferably prepared by mixing about 25 g of 3-mercaptopyl trimethoxy-silane in about 1 liter of toluene, as in FIG. 3A, the semiconductor substrate is dipped in a piranha solution which is thought to form free hydroxyl groups (—OH) on the surface thereof so that surface modification can be effected.

In succession, after the self-assembled monolayer 112, which has either the amine silane groups or the thiol silane groups bonded at the terminal ends is formed, the resultant semiconductor substrate 100 is preferably cleaned with ethanol using ultrasonication to substantially remove any reaction residues. Then, the resultant cleaned semiconductor substrate 100 is then baked in a vacuum oven at a temperature of about 80~120° C. for about 20~40 minutes to stabilize the bonding structure of the amine silane groups or thiol silane groups.

Figure 4:
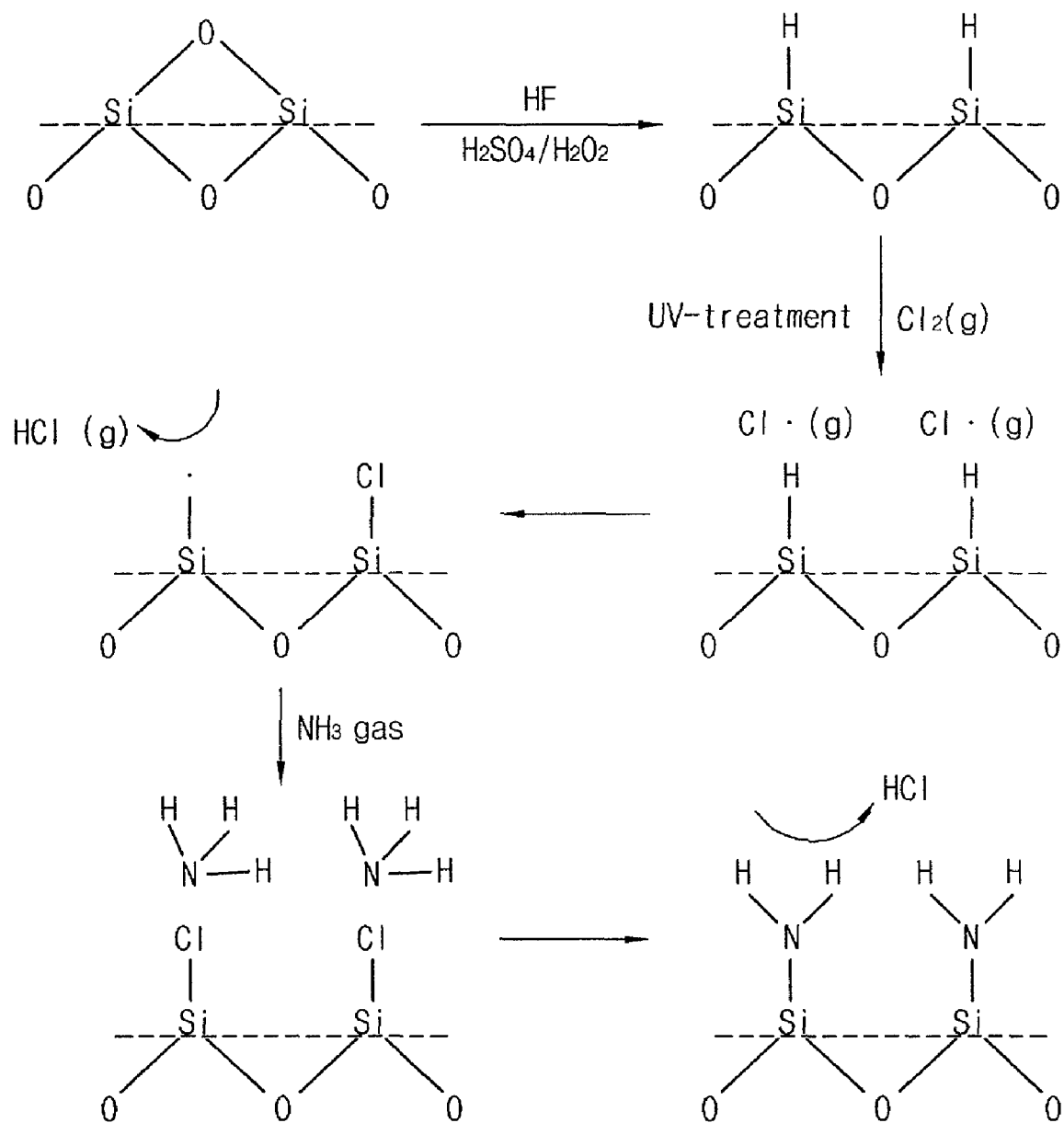
FIG. 4 is a reaction formula illustrating a reaction mechanism when forming a self-assembled monolayer having amine groups in a dry type in accordance with a still further embodiment of the present invention.

Meanwhile, although the self-assembled monolayer is preferably formed in a wet type reaction environment, i.e., liquid phase, in the aforementioned embodiments, it is conceivable and understood that the present invention can also be implemented by a forming the self-assembled monolayer in a dry type reaction environment, i.e., gaseous phase, such as shown in FIG. 4.

FIG. 4 is a reaction formula illustrating a reaction mechanism when forming a self-assembled monolayer having amine groups in a dry type in accordance with a still further embodiment of the present invention.

Referring to FIG. 4, the semiconductor substrate is sequentially dipped in a piranha solution which is prepared by mixing $H_2SO_4$ and $H_2O_2$ at a ratio of about 3:2 and followed by a dipping in a dilute HF solution, for about 4~6 minutes and about 8~12 minutes, respectively. As a result, the surface of the semiconductor substrate is modified to have hydrogen groups (—H).

Next, a halogen containing gas, preferably $Cl_2$ gas, is then flowed across and onto the surface of the resultant surface-modified semiconductor substrate for preferably at least for about several seconds. Afterwards, UV light is irradiated onto this surface to promote substitution of the hydrogen groups (—H) with the halogen entities, preferably chlorine groups (—Cl). In a preferred embodiment, $Cl_2$ gas and an inert gas (e.g., He, Ne, Ar, Kr, Xe, and $N_2$) preferably $N_2$ gas, are simultaneously mixed together and are flowed over the surface. The $Cl_2$ gas and the $N_2$ gas are preferably flowed over the surface such that the partial pressure of the $Cl_2$ gas is set at about 1~5 Torr so that the substitution of the chlorine for the hydrogen at the surface can be readily implemented. It is preferable that the UV irradiation exposure duration is for about 10~60 seconds while the semiconductor substrate is maintained at a temperature of about 25~75° C. It is thought that as the $Cl_2$ gas is dissociated by the UV irradiation into chlorine free radicals (—Cl), the chlorine free radicals groups (—Cl) substitute themselves for the hydrogen groups (—H).

Thereafter, an amine bearing gas, such as $NH_3$, $NH_2NH_2$, and $CH_3NH_2$ gas, preferably $NH_3$ gas, is then flowed over the resultant semiconductor substrate. By doing this, a self-assembled monolayer, which has the amine groups bonded to the terminal ends, is subsequently formed. Here, the $NH_3$ gas is preferably flowed for about 10~15 minutes such that the partial pressure of the $NH_3$ gas is maintained at about 8~12 Torr so that the bonding of the amine groups can be effectively implemented.

After the self-assembled monolayer having the amine groups is formed in the dry type, the resultant semiconductor substrate is baked at a temperature of about 25~75° C. where it is thought that the amine groups bonding structure is stabilized.

Figure 2B:
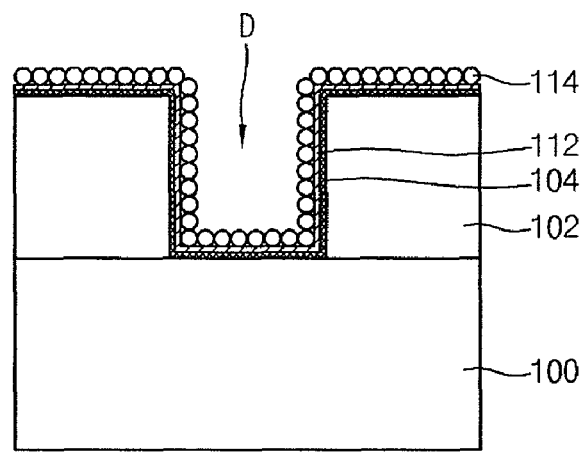

Referring to FIG. 2B, the resultant semiconductor substrate 100, which is formed with the self-assembled monolayer 112, is then dipped for about 40~100 minutes in an aqueous solution in which catalytic particles are suspended or dispersed. By doing this, a plurality of catalytic particles 114 are adsorbed onto the surface of the self-assembled monolayer 112. The catalytic particles 114 comprise particles of any one selected from Au, Cu, Pt, Ni, and admixtures thereof, preferably, Au, and preferably have a mean diameter of 2~3 nm.

The aqueous solution, in which the catalytic particles, for example, Au particles, are dispersed, is preferably prepared by mixing about 0.000256 M (moles/liter) of $AuCl_4$, about 0.00096 M of trisodium citrate, and about 0.000454 M of sodium borohydride. When dipping the semiconductor substrate 100, the temperature of a bath is preferably maintained at about 20~30° C.

When the semiconductor substrate 100 which is formed with the self-assembled monolayer 112 is exposed, preferably dipped, in the solution in which the Au particles are suspended, the mean distance interval between the adjacent adsorbed Au particles is preferably usually about 8~9 nm. In this regard, in order to apply the method according to the present invention to a pattern below 24 nm, the mean distance interval between adjacent Au particles should be decreased. To achieve this at least one of the pH and/or the temperature of the aqueous solution, that suspends these catalytic particles, can be altered to change the mean distance interval between the adjacent adsorbed catalytic particles. For example, in the embodiment of the present invention, the pH and the temperature of the aqueous solution in which the catalytic particles are dispersed are respectively adjusted to a pH of about 2.5~5 and a temperature of about 40~60° C. By doing this, the mean distance interval between the catalytic particles 114 becomes about 4~7 nm.

After the catalytic particles 114 are adsorbed, in order to remove sodium and chlorine ions as well as other reaction residues, the resultant semiconductor substrate is cleaned at least once with purified water, such as distilled and/or deionized water.

Figure 2C:
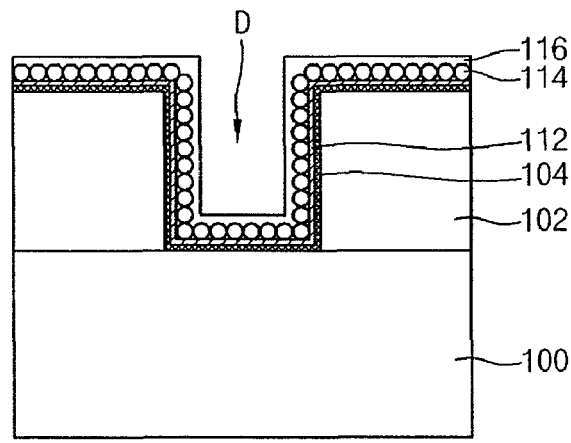

Referring to FIG. 2C, a copper seed layer 116 is formed on the self-assembled monolayer 112 which already has the catalytic particles 114 adsorbed thereto. This copper seed layer 116 is preferably performed using an electroless plating technique. Here, the formation of the copper seed layer 116 is implemented so that the resultant semiconductor substrate 100, having the adsorbed catalytic particles 114, is dipped in an electroless copper plating solution for a limited amount of time. One preferred an electroless copper plating solution is prepared by mixing about 0.01 M of copper(II) sulfate, about 0.025 M of EDTA (ethylenediamine tetraacetic acid) as a complexing agent, about 3~10 milliliters per liter of HCHO as a reducing agent, about 5 milligram per liter of 2,2'-dipyridyl as a stabilizer, and about 0.001 grams per liter of polyethylene glycol p-(1,1,3,3-tetramethylbutyl)-phenyl ether also known more commonly as Triton x-100 (trademarked by Union Carbide) which is used as a nonionic surface, and in which the pH of the electroless copper plating solution is adjusted to about 12.5. The temperature of the electroless copper plating solution is maintained at about 50~70° C., and a plating time is set to about 20~60 seconds.

Here, in the embodiment of the present invention, because the mean diameter size of the catalytic particles 114 is adjusted to about 2~3 nm and, in particular, the mean distance interval between the adjacent adsorbed catalytic particles 114 is adjusted to be about 4~7 nm so that the agglomeration of the catalytic particles 114 is prevented or minimized, the copper seed layer 116 can be formed through electroless plating to a relative uniform thickness as a thin film having a thickness of several nanometers.

Figure 2D:
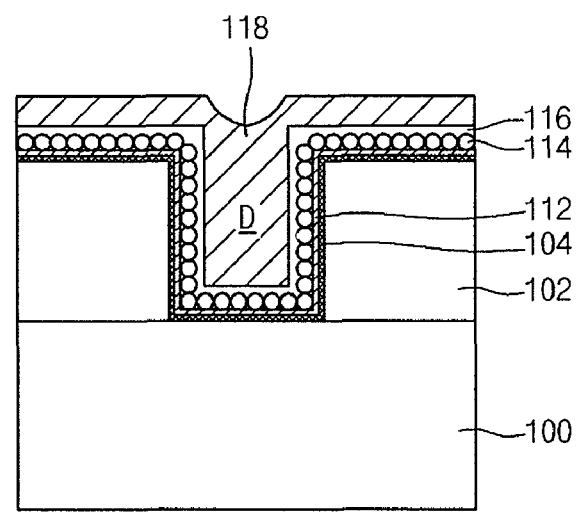

Referring to FIG. 2D, a copper layer 118 is formed on the copper seed layer 116 which substantially fills in the metal line forming region D. Both electroless plating and electroplating can be employed to form the copper layer 118.

For example, after forming the copper seed layer 116 through electroless plating, the copper layer 118 can be formed successively through electroless plating to fill the metal line forming region D. The formation of the copper layer 118 through electroless plating can be implemented for about 50~100 seconds in the electroless plating solution which has been used for forming the copper seed layer 116. When forming the copper layer 118 through electroless plating, in place of the electroless copper plating solution used for forming the copper seed layer 116, an electroless copper plating solution, which is prepared by making a solution containing about 0.04 M of copper(II) sulfate, about 0.08 M of EDTA (ethylenediamine tetraacetic acid), 0.08 M of glyoxylic acid, and 1 ppm of PEG4000 (polyethylene glycol having a molar mass of about 4000 g/mol, of which the final pH of the solution is adjusted to about 12.6, and of which the temperature is maintained at about 70° C., can be used.

Conversely, the formation of the copper layer 118 through electroplating is implemented for about 2~9 minutes in an electroplating solution which is prepared by making a solution containing about 0.26 M of copper(II) sulfate, about 2.00 M of $H_2SO_4$, about 50 ppm of HCl, 100 ppm of PEG2000, and about 1000 ppm of SPS (bis-(3-sodiumsulfopropyl disulfide). The temperature of the electroplating solution is maintained at about room temperature.

Here, in the embodiment of the present invention, due to the fact that the copper seed layer 116 can be formed through electroless plating to a relative uniform thickness as a thin film, when filling the copper layer 118 in the metal line forming region D, it is possible to prevent or at least minimize the occurrence of voids or seams from being created in the metal line forming region D.

Figure 2E:
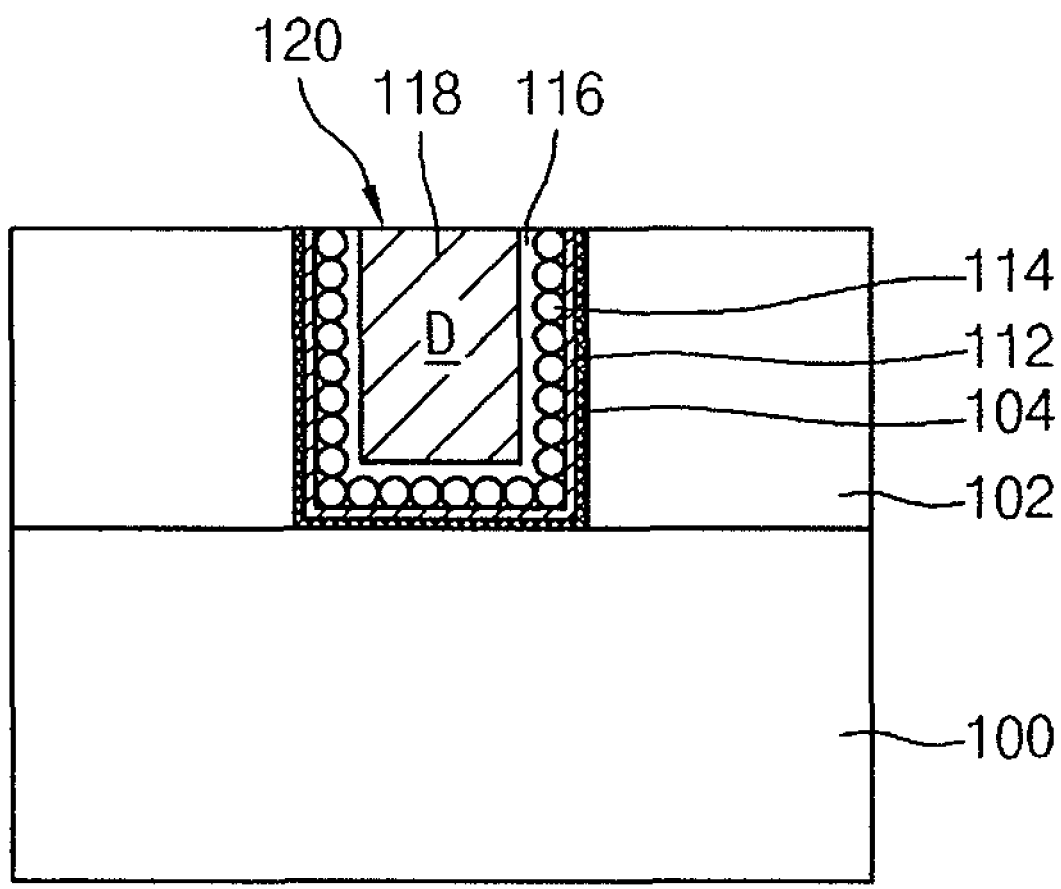

Referring to FIG. 2E, the copper layer 118, the copper seed layer 116, the catalytic particles 114, the self-assembled monolayer 112 and the barrier layer 104 are removed through a CMP process until the interlayer dielectric 102 is exposed. By doing this a copper line 120 is subsequently formed in the metal line forming region D.

As is apparent from the above description, in the present invention, a copper seed layer can be formed by using electroless plating to a relative uniform thickness as a thin film owing to the formation of a self-assembled monolayer and the adsorption of catalytic particles at regular intervals. Accordingly, in the present invention, the difficult in forming a relatively uniformly formed copper seed layer can be overcome when conducting an electroless plating process that is eventually used to fill in a metal line forming region. As a result it is possible to prevent or at least minimize the occurrence of unwanted voids or seams from being created in the metal line forming region which are brought about by non-uniform thick copper seed layer. Therefore, in the present invention, it is possible to realize a copper line with improved reliability. Further, a ULSI circuit below a sub-micrometer level can be stably realized through electroless plating.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for forming a copper line of a semiconductor device, comprising the steps of:
    forming an interlayer dielectric on a semiconductor substrate having a metal line forming region;
    forming a self-assembled monolayer on the interlayer dielectric and on a surface of the metal line forming region;
    adsorbing catalytic particles on a surface of the self-assembled monolayer;
    forming a copper seed layer on the self-assembled monolayer having the catalytic particles adsorbed thereto by using an electroless plating technique; and
    forming a copper layer on the copper seed layer to substantially fill in the metal line forming region,
    wherein the step of forming the self-assembled monolayer comprises the steps of:
    modifying a surface of the semiconductor substrate having the metal line forming region to form hydroxyl groups bonded to the surface of the semiconductor substrate;
    dipping the resultant surface-modified semiconductor substrate in a chemical solution having either amine silane groups or thiol silane groups mixed in an organic solvent to bond either the amine silane groups or the thiol silane groups to the surface of the semiconductor substrate; and
    silanizing the amine silane groups or thiol silane groups bonded to the surface of the semiconductor substrate.

2. The method according to claim 1 further comprises the step of forming a barrier layer on the interlayer dielectric including a surface of the metal line forming region wherein forming the barrier layer is performed after the step of forming the interlayer dielectric having the metal line forming region and before the step of forming the self-assembled monolayer.

3. The method according to claim 1, wherein the step of modifying the surface of the semiconductor substrate to form the hydroxyl groups is implemented by dipping the resultant semiconductor substrate is dipped in a piranha solution, wherein the piranha solution comprises $H_2SO_4$ and $H_2O_2$ mixed together.

4. The method according to claim 1, wherein the substance having either the amine silane groups or the thiol silane groups includes 3-aminopropyl triethoxy-silane or 3-mercaptopropyl trimethoxy-silane, respectively.

5. The method according to claim 1, wherein the chemical solution is prepared by mixing about 35 g of the substance having either the amine silane groups or the thiol silane groups into about 1 liter of the organic solvent.

6. The method according to claim 1, wherein the step of silanizing the amine silane groups or thiol silane groups is implemented at a temperature of about 50 to 70° C. for about 60 to 400 minutes.

7. The method according to claim 1 further comprises the steps of:
    cleaning the resultant semiconductor substrate so that reaction residues are removed; and
    baking the resultant cleaned semiconductor substrate so that a bonding structure of the amine silane groups or thiol silane groups is stabilized, wherein the cleaning and baking steps are performed after the step of silanizing the amine silane groups or thiol silane groups.

8. The method according to claim 1, wherein the step of cleaning the resultant semiconductor substrate is implemented using at least one of dipping the semiconductor substrate in ethanol and ultrasonicating the semiconductor substrate.

9. The method according to claim 1, wherein the step of baking the resultant cleaned semiconductor substrate is implemented in a vacuum oven at a temperature of about 80 to 120° C. for about 20 to 40 minutes.

10. The method according to claim 1, wherein the catalytic particles comprise any one of Au, Cu, Pt, Ni and admixtures thereof.

11. The method according to claim 1, wherein the catalytic particles have a mean diameter of about 2 to 3 nm.

12. The method according to claim 1, wherein the step of adsorbing the catalytic particles is implemented by dipping the semiconductor substrate in an aqueous solution containing suspended catalytic particles for about 40 to 100 minutes in a manner such that the resultant semiconductor substrate to form the self-assembled monolayer.

13. The method according to claim 12, wherein the mean distance interval between adjacent adsorbed catalytic particles is adjusted by changing the pH and/or the temperature of the aqueous solution.

14. The method according to claim 13, wherein the pH of the aqueous solution in which the catalytic particles are suspended is adjusted to about 2.5 to 5.

15. The method according to claim 13, wherein the temperature of the aqueous solution in which the catalytic particles are suspended is adjusted to 40 to 60° C.

16. The method according to claim 13, wherein the mean distance interval between adjacent adsorbed catalytic particles is adjusted to about 4 to 7 nm.

17. The method according to claim 1 further comprises the step of cleaning the resultant semiconductor substrate having the catalytic particles adsorbed to substantially remove any reaction residues, wherein the cleaning step is performed after the step of adsorbing the catalytic particles and before the step of forming the copper seed layer.

18. The method according to claim 17, wherein the step of cleaning the resultant semiconductor substrate is implemented at least one time using highly purified water.

19. The method according to claim 1, wherein the step of forming the copper layer is implemented by using an electroless plating technique.

20. The method according to claim 19, wherein the step of forming the copper layer is implemented for about 50 to 100 seconds in an electroless plating solution.

21. The method according to claim 1, wherein the step of forming the copper layer is implemented by using an electroplating technique.

22. The method according to claim 1 further comprises the step of removing the copper layer through a CMP process until the interlayer dielectric is exposed, wherein the removing step is performed after the step of forming the copper layer to fill the metal line forming region.

23. A method for forming a copper line of a semiconductor device, comprising the steps of:
    forming an interlayer dielectric on a semiconductor substrate having a metal line forming region;
    forming a self-assembled monolayer on the interlayer dielectric and on a surface of the metal line forming region;
    adsorbing catalytic particles on a surface of the self-assembled monolayer;
    forming a copper seed layer on the self-assembled monolayer having the catalytic particles adsorbed thereto by using an electroless plating technique; and forming a copper layer on the copper seed layer to substantially fill in the metal line forming region, wherein the step of forming the self-assembled monolayer comprises the steps of:

modifying a surface of the semiconductor substrate including the metal line forming region to form hydroxyl groups at the surface of the semiconductor substrate;

flowing dichlorine ($Cl_2$) gas and irradiating UV onto the semiconductor substrate having undergone surface modification to bond chlorine groups to the surface of the semiconductor substrate; and flowing Ammonia ($NH_3$) gas onto the surface of the resultant semiconductor substrate to substitute by amine groups for the bonded chlorine groups at the surface of the semiconductor substrate.

24. The method according to claim 23, wherein the step of modifying the surface of the semiconductor substrate is implemented by sequentially dipped the surface of the semiconductor substrate in a piranha solution and in a diluted HF solution, wherein the piranha solution comprises a mixture of $H_2SO_4$ and $H_2O_2$.

25. The method according to claim 24, wherein the piranha solution is a mixture comprising $H_2SO_4$ and $H_2O_2$ at a ratio of 3:2.

26. The method according to claim 24, wherein the semiconductor substrate is sequentially dipped in the piranha solution and in the diluted HF solution for about 4-6 minutes and about 8-12 minutes, respectively.

27. The method according to claim 23, wherein while flowing the $Cl_2$ gas, $N_2$ gas is also simultaneously flowing onto the surface of the semiconductor substrate.

28. The method according to claim 27, wherein the $Cl_2$ gas is set flowing at a partial pressure of about 1 to 5 Torr.

29. The method according to claim 23, wherein the step of irradiating UV is implemented for about 10~60 seconds while the semiconductor substrate is maintained at a temperature of 25 to 75° C.

30. The method according to claim 23, wherein the step of flowing the $NH_3$ gas is implemented for about 10 to 15 minutes and the $NH_3$ gas is at a partial pressure of about 8 to 12 Torr.

31. The method according to claim 23 further comprises the step of baking the resultant semiconductor substrate to stabilize a bonding structure of the amine groups, wherein the baking step is performed after the step of flowing the $NH_3$ gas.

32. The method according to claim 31, wherein the step of baking the resultant semiconductor substrate is implemented at a temperature of about 25 to 75° C.

* * * * *